United States Patent
Dase

(10) Patent No.: US 10,656,197 B2
(45) Date of Patent: May 19, 2020

(54) ACCURATE FAULT LOCATION METHOD BASED ON LOCAL MEASUREMENTS AND REMOTE CURRENTS

(71) Applicant: Schweitzer Engineering Laboratories, Inc., Pullman, WA (US)

(72) Inventor: Kanchanrao Gangadhar Dase, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/110,198

(22) Filed: Aug. 23, 2018

(65) Prior Publication Data

US 2020/0064391 A1 Feb. 27, 2020

(51) Int. Cl.
*G01R 31/08* (2020.01)

(52) U.S. Cl.
CPC ......... *G01R 31/088* (2013.01); *G01R 31/085* (2013.01)

(58) Field of Classification Search
CPC ... G01R 31/025; G01R 31/085; G01R 31/088
See application file for complete search history.

(56) References Cited

U.S. PATENT DOCUMENTS

| | | | |
|---|---|---|---|
| 2010/0277181 A1* | 11/2010 | Saha .................. | G01R 31/088 324/521 |
| 2011/0184673 A1 | 7/2011 | Takani | |
| 2017/0315168 A1* | 11/2017 | Benmouyal .......... | G01R 31/085 |

OTHER PUBLICATIONS

Karl Zimmerman and David Costello, "Impedance-Based Fault Location Experience," proceedings of the 58th Annual Conference for Protective Relay Engineers, College Station, TX, Apr. 2005.

H. Miller, J. Burger, N. Fischer and B. Kasztenny, "Modern Line Current Differential Protection Solutions" proceedings of the 36th Annual Western Protective Relay Conference, Spokane, WA, Oct. 2009.

M. M. Saha, J. Izykowski, and E. Rosolowski, "Two-end and Multi-end Fault-location Algorithms," Fault Location on Power Networks. Springer, London, NY, 2010, pp. 306-309.

Agarwal, et al. "A Practical Approach to Accurate Fault Location on Extra High Voltage Teed Feeders", IEEE Transactions on Power Delivery, vol. 8, No. 3, Jul. 1993.

Gong, et al. "Automated Fault Location System for Nonhomogeneous Transmission Networks", Presented at the 2012 Texas A&M Conference for Protective Relay Engineers. IEEE Feb. 2012.

Izykowski, et al. "A Fault-Location Method for Application With Current Differential Relays of Three-Terminal Lines", IEEE Transactions on Power Delivery, vol. 22. No. 4, Oct. 2007.

(Continued)

*Primary Examiner* — Noam Reisner
(74) *Attorney, Agent, or Firm* — Bradley W. Schield

(57) ABSTRACT

The present disclosure relates to a computationally efficient technique for determining a location of a fault on a power line using local measurements and remote current measurements. For example, a method may include receiving one or more local measurements of a power line. The method includes receiving a signal indicating one or more remote current measurements of the power line. The method includes determining a location of a fault on the power line based on a fault voltage multiplied by a conjugate of a compensated differential current. The method includes providing the location of the fault.

22 Claims, 8 Drawing Sheets

(56) References Cited

OTHER PUBLICATIONS

Izykowski, et al "Accurate Location of Faults in Parrallel Transmission Lines Under Availability of Measurements from One Circuit Only", 14th PSCC, Sevilla, Jun. 2002.
Izykowski, et al "Accurate Location of Faults of Faults on Power Transmission Lines With Use of Two-End Unsynchronized Measurements", IEEE Transactions on Power Delivery, vol. 21, No. 2, Apr. 2006.
Izykowski, et al "Accurate Noniterative Fault Location Algorithm Utilizing Two-End Unsynchronized Measurements", IEEE Transactions on Power Delivery, vol. 25, No. 1, Jan. 2010.
Izykowski, et al "Fundamental Frequency Equivalenting of Series Capacitors with MOVs in a Series-Compensated Line Under Fault Conditions", Dec. 2000.
Saha, et al "Review of Fault Location Techniques for Distribution Systems", Power Systems and Communcations Infrastructures for the Future, Beijing, Sep. 2002.
Saha, et Al "ATP-EMTP Investigation of a New Distance Protection Principle for Series Compensated Lines", International Conference on Power Systems Transients, New Orleans, USA, 2003.

\* cited by examiner

ACCURATE FAULT LOCATION METHOD BASED ON LOCAL MEASUREMENTS AND REMOTE CURRENTS

TECHNICAL FIELD

The present disclosure relates generally to electric power delivery systems and, more particularly, to locating faults on power lines.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power lines may be used to provide electrical energy from a source (such as, for example, a utility source, a generator, a distributed generator, or the like) to one or more loads. To conduct electricity between the source and the loads, power lines may include one or more conductors that are installed on overhead structures or buried underground. Due to aging and/or environmental conditions, such as wind, rain, animals, or vehicles, faults on power lines may occur in which power may not be delivered to the loads as desired.

Relays, faulted circuit indicators, and other intelligent electronic devices (IEDs) may be used to determine the location of the fault. The location of the fault may be used in various ways during operation of the power system. For example, the location of the fault may be sent to a control monitoring station to be displayed on a display to allow operators to diagnose the cause of the fault and to perform maintenance on the power line at the location. In this example, by determining an accurate location of the fault, the power line may be brought back on-line faster than if an accurate location was not determined, thereby allowing power to be delivered to loads in a more reliable manner (i.e., with less downtime). That is, by improving fault location technology, such as relay, FCIs, and other IEDs, through more accurate location determinations of faults on power lines, power delivery systems may operate more reliably (e.g., with less downtime).

One technique to determine fault locations may involve measurements from at least two IEDs. Due to various reasons, IEDs may communicate current without communicating voltage. For example, IEDs may not communicate voltage because of limited bandwidth availability. Accordingly, it is desirable to determine accurate locations of faults on power lines with current measurements but not voltage measurements from a remote device.

Figure 1:
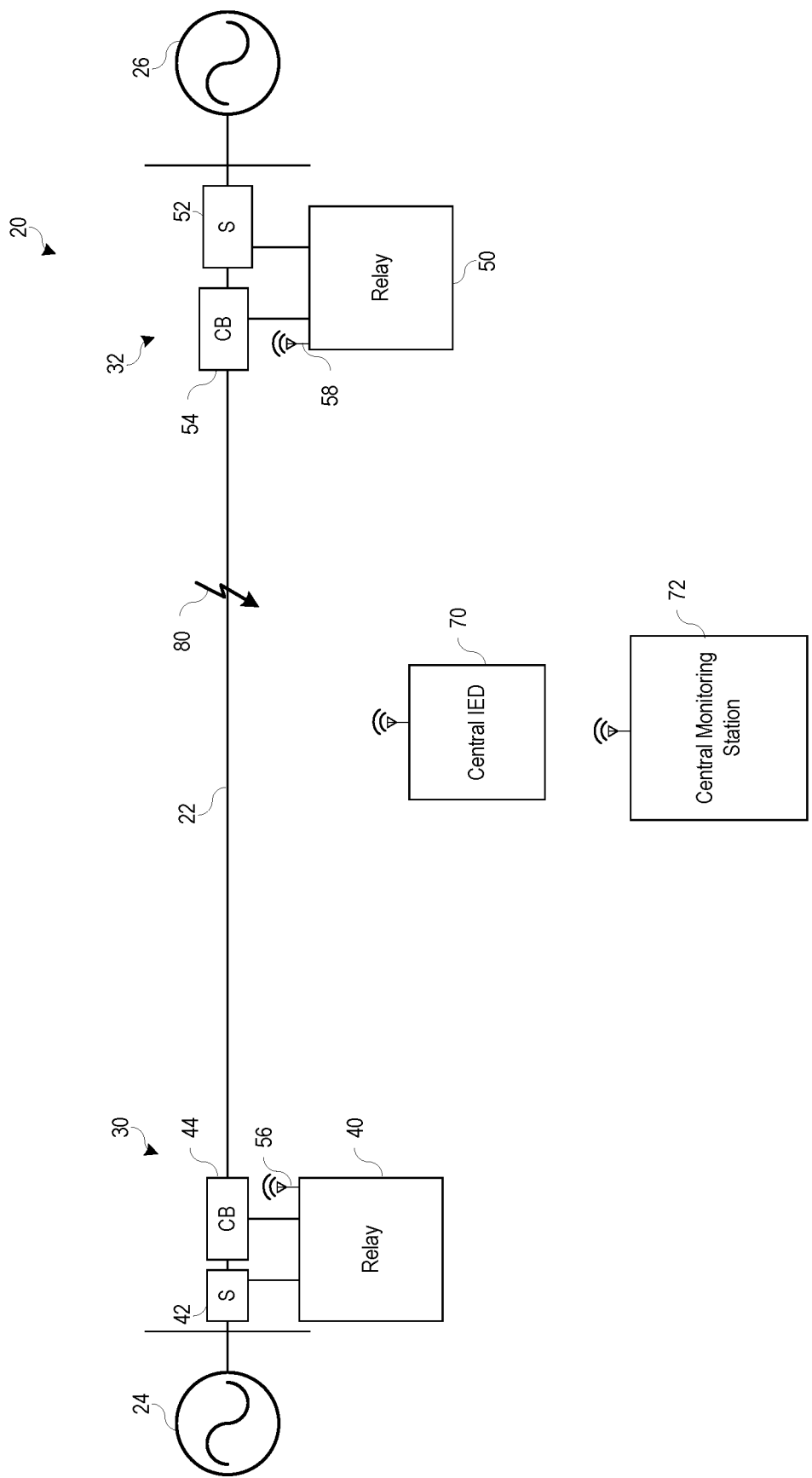
FIG. 1 illustrates a simplified one-line diagram of an electric power delivery system having a local relay and a remote relay that determine the location of a fault on a power line, in accordance with embodiments of the present disclosure.

FIG. 1 illustrates a one-line diagram of an electric power delivery system 20, in accordance with an embodiment. The electric power delivery system 20 may be any suitable electric power delivery system 20, such as a three-phase power system. Although the one-line diagram is used as a simplified example, the systems and methods disclosed herein may be used in conjunction with any suitable power delivery system, such as a power transmission system, a power distribution system, radial power distribution systems, bi-directional power systems, or the like. The electric power delivery system 20 may be configured to generate, transmit, and distribute electric energy to loads. Electric power delivery systems may include equipment, such as electric generators, power transformers, power transmission and/or delivery lines, circuit breakers, busses, loads, and the like. A variety of other types of equipment may also be included in electric power delivery system 20, such as voltage regulators, capacitor banks, and a variety of other types of equipment. In the illustrated embodiment, the power delivery system 20 includes a power line 22 that transfers electrical energy from a first power generator 24 and a second power generator 26 to one or more loads.

The power delivery system 20 may be monitored, controlled, automated, and/or protected using protection systems 30 and 32. The protection systems 30 and 32 may each include one or more IEDs, such as a local relay 40 and a remote relay 50. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment. Note that, as used herein, the local relay may refer to the relay that determines the location of the fault as a distance from that relay. Further, remote may refer to the relay that transmits data (e.g., current measurements) to be used by the local relay in determining the location of the fault. That is, the remote relay may be at any suitable distance from the local relay.

As used herein, an IED (such as local relay 40 and remote relay 50) may refer to any microprocessor-based device that monitors, controls, automates, and/or protects monitored equipment within the power delivery system 20. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A common time signal may be distributed throughout the power delivery system 20. Utilizing a common or universal time source may enable the IEDs to have a synchronized time signal that can be used to generate time synchronized data. In various embodiments, relays 40 and 50 may receive a common time signal. The time signal may be distributed in the power delivery system 20 using a communications network or using a common time source, such as a Global Navigation Satellite System ("GNSS"), or the like.

According to various embodiments, the local relay 40 and the remote relay 50 may communicate, via communication circuitry 56 and 58, with each other, with one or more other IEDs 70, and/or with a central monitoring system 72. In some embodiments, the local relay 40 and the remote relay 50 may communicate with the IED 70 and/or the central monitoring station 72 directly or via a communication network. The central monitoring system 72 may include one or more of a variety of types of systems. For example, the central monitoring system 72 may include a supervisory control and data acquisition (SCADA) system and/or a wide area control and situational awareness (WACSA) system. The IED 70 may be in communication with the local relay 40 and the remote relay 50. The local relay 40 and the remote relay 50 may communicate over various media such as direct communication or over a wide-area communications network.

Communication via network may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multifunction hardware (e.g., processors, computer-readable storage media, communications interfaces, etc.) that can be utilized in order to perform a variety of tasks that pertain to network communications and/or to operation of equipment within the power delivery system 20.

The local relay 40 and the remote relay 50 may monitor the electrical characteristics of the electrical energy being transferred on the power line 22 via sensor circuitry 42 and 52. Each of the local relay 40 and the remote relay 50 may be communicatively coupled to a respective circuit breaker 44 and 54. In some embodiments, upon occurrence of a fault 80, the local relay 40, the remote relay 50, the other IED 70, and/or the central monitoring station 72, may effect a control operation on the power delivery system 20, such as opening the local circuit breaker 44 or opening the remote circuit breaker 54.

The local relay 40 may provide an indication of a location of the fault 80. Depending on the accuracy of the location, the local relay 40 may allow the electric power delivery system 20 to operate more reliably with less downtime.

Figure 2:
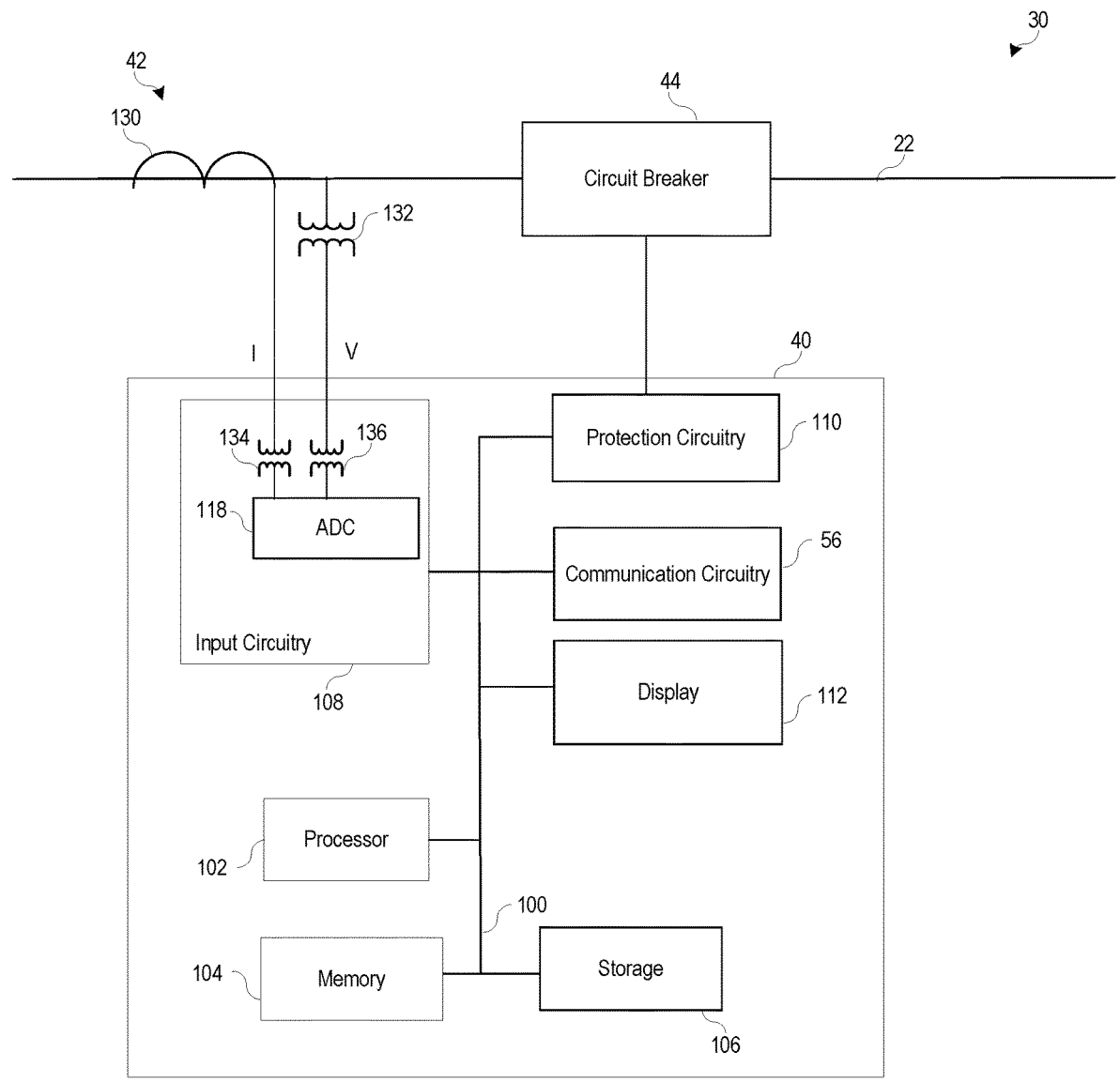
FIG. 2 is a block diagram of the local relay of FIG. 1, in accordance with embodiments of the present disclosure.

FIG. 2 illustrates a block diagram of the protection system 30 that may be used to determine a location of a fault. In the illustrated embodiment, the protection system 30 includes the local relay 40, the sensor circuitry 42, and the circuit breaker 44. The local relay 40 may include a bus 100 connecting a processor 102 or processing unit(s) to a memory 104, a computer-readable storage medium 106, input circuitry 108, protection circuitry 110, and one or more alarms 112. The computer-readable storage medium 106 may include or interface with software, hardware, or firmware modules for implementing various portions of the systems and methods described herein. The computer-readable storage medium 106 may be the repository of one or more modules and/or executable instructions configured to implement any of the processes described herein. In some embodiments, the computer-readable storage medium 106 and the modules therein may all be implemented as hardware components, such as via discrete electrical components, via a Field Programmable Gate Array ("FPGA"), and/or via one or more Application Specific Integrated Circuits ("ASICs").

The processor 102 may be configured to process inputs received via the input circuitry 108 and the communication circuitry 56. The processor 102 may operate using any number of processing rates and architectures. The processor 102 may be configured to perform various algorithms and calculations described herein using computer executable instructions stored on computer-readable storage medium 106. Processor 102 may be embodied as a microprocessor, a general purpose integrated circuit, an ASIC, a FPGA, and/or other programmable logic devices. In some embodiments, the processor 102 and/or the memory 104 may be referred to generally as processing circuitry.

The sensor circuitry 42 may include current sensor circuitry, such as a current transformer 130, and voltage sensor circuitry, such as a potential transformer 132. The input circuitry 108 may receive electric current and voltage signals from the current transformer 130 and the voltage transformer 132 respectively, transform the signals using respective potential transformer(s) 134 and 136 to a level that may be sampled, and sample the signals using, for example, A/D converter(s) 118 to produce digital signals representative of measured current and measured voltage on the power line. Similar values may also be received from other distributed controllers, station controllers, regional controllers, or centralized controllers. The values may be in a digital format or other format. In certain embodiments, the input circuitry 108 may be utilized to monitor current signals associated with a portion of an electric power delivery system 20. Further, the input circuitry 108 may monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag and the like.

The A/D converter 118 may be connected to the processor 102 by way of the bus 100, through which digitized representations of current and voltage signals may be transmitted to the processor 102. As described above, the processor 102 may be used to monitor and/or protect portions of the electric power delivery system 20, and issue control instructions in response to the same (e.g., instructions implementing protective actions). The processor 102 may determine a location of a fault on a power line 22 based on the digitized representations of the current and voltage signals.

The communication circuitry 56 may include a transceiver to communicate with one or more other IEDs and/or the central monitoring station 72, or the like. For example, the transceiver may receive a signal indicating one or more current measurements from the remote relay 50. In some embodiments, the processor 102 may cause the transceiver to send a signal indicating the location of the fault 80. For instance, the processor 102 may send, via the transceiver of the communication circuitry 56, a signal indicating the location of the fault to the central monitoring station 72.

The local relay 40 may include a display screen 112 to display an indication of the location of the fault to notify an operator of the location. Further, the processor 102 may activate alarms, such as LEDs or alerts on the display screen, upon detection of a fault. In certain embodiments, the processor 108 may effect a control operation on the electric power delivery system 20 via the protection circuitry 110. For example, the processor 102 may send a signal to control operation of the circuit breaker 44 to disconnect the power line 22 from a power source, such as the generator 24, upon detecting the fault.

Figure 3:
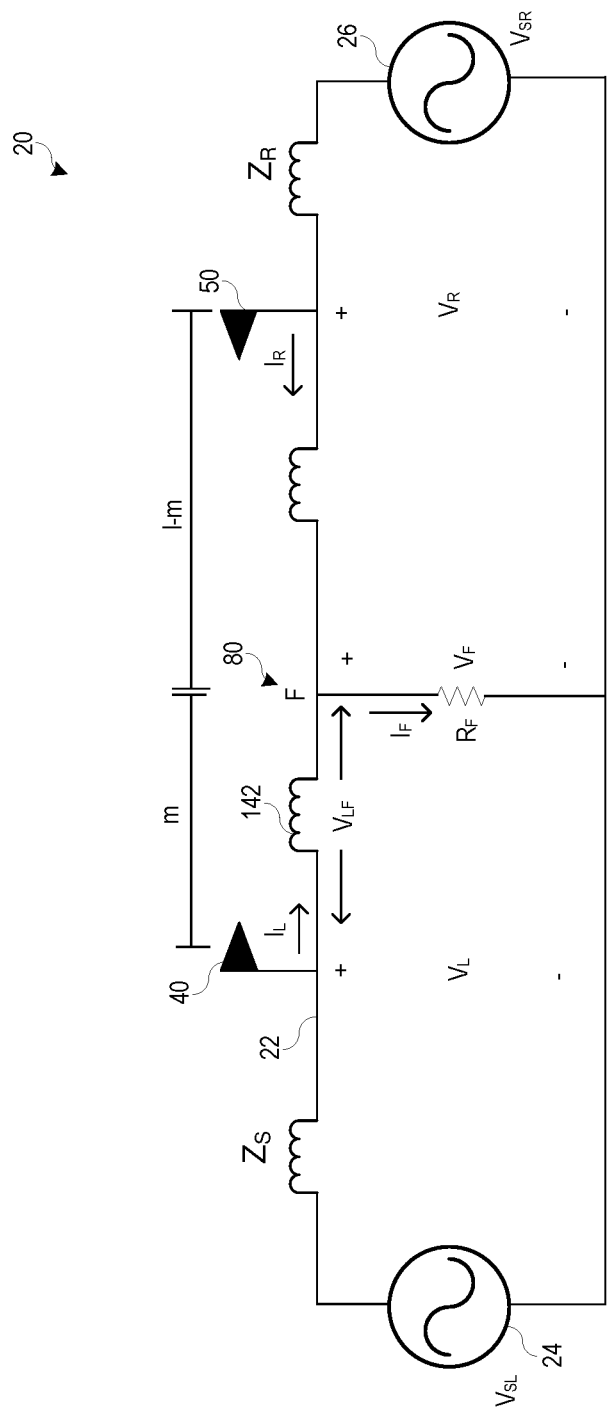
FIG. 3 is a single phase representation of the electric power delivery system of FIG. 1, in accordance with embodiments of the present disclosure.

FIG. 3 illustrates a single phase representation of the power delivery system 20 that includes the power line 22 electrically coupled between the local generator 24 and the remote generator 26. The circuit diagram includes a voltage drop ($V_{LF}$) between the local relay 40 and the fault 80 due to impedances 142 of the power line 22. The fault location for such faults may be determined by equating the fault voltage ($V_F$) to the sum of the voltage drop of that phase from the local relay 40 to the fault point and the voltage at the fault point:

$$V_L = V_{LF} + V_F \qquad \text{Eq. 1}$$

where $V_L$ is the faulted phase voltage detected at the local relay 40, $V_{LF}$ is the voltage drop between the local relay 40 and the fault, and $V_F$ is the voltage of the fault.

As fault voltage can be written in terms of fault current ($I_F$) through the fault resistance ($R_F$), equation (1) may also be expressed as:

$$V_L = V_{LF} + I_F R_F \qquad \text{Eq. 2}$$

As the fault resistance ($R_F$) is not known, it is eliminated by multiplying both sides of equation (2) with the conjugate of the fault current ($I_F^*$) and by equating the imaginary parts of both sides:

$$Im[V_L I_F^*] = Im[V_{LF} I_F^* + I_F R_F I_F^*] \qquad \text{Eq. 3}$$

As $Im[I_F R_F I_F^*] = 0$, $$Im[V_L I_F^*] = [V_{LF} I_F^*] \qquad \text{Eq. 4}$$

Accordingly, determining accurate fault location may be based on accuracy of the voltage drop from the relay to the fault point and accuracy of the fault current angle. As mentioned above, due to various reasons, the local relay 40 may receive current measurements from the remote relay 50 without receiving voltage measurements. As such, various techniques may be used to determine a location of a fault without voltage measurements.

A first technique determines the fault location but does not account for the shunt capacitance of the power line 22. In this method, the relay to fault point voltage drop ($V_{LF}$) may be determined in terms of sequence currents and sequence impedances to be:

$$V_{LF} = mZ_1\left[(I_{1L} + I_{2L} + I_{0L}) + \left(\frac{Z_0 - Z_1}{Z_1}\right)(I_{0L})\right] \qquad \text{Eq. 5}$$

where m is the distance to the fault from the local relay 40 (in kilometers or miles), $I_{1L}$, $I_{2L}$, and $I_{0L}$ is the positive, negative, and zero sequence currents, respectively, at the local relay 40, $Z_0$ is the zero sequence impedance, and $Z_1$ is the positive sequence impedance of power line 22. Equation (5) may be accurate if the sequence currents measured by the local relay 40 are the same until the fault point. However, shunt capacitances of the power line 22 may add currents in to the power line 22 and thus introduce an error in the estimation of the voltage drop from the local relay 40 to the fault 80 using equation (5). This error may affect the accuracy of estimating the fault location.

Figure 4:
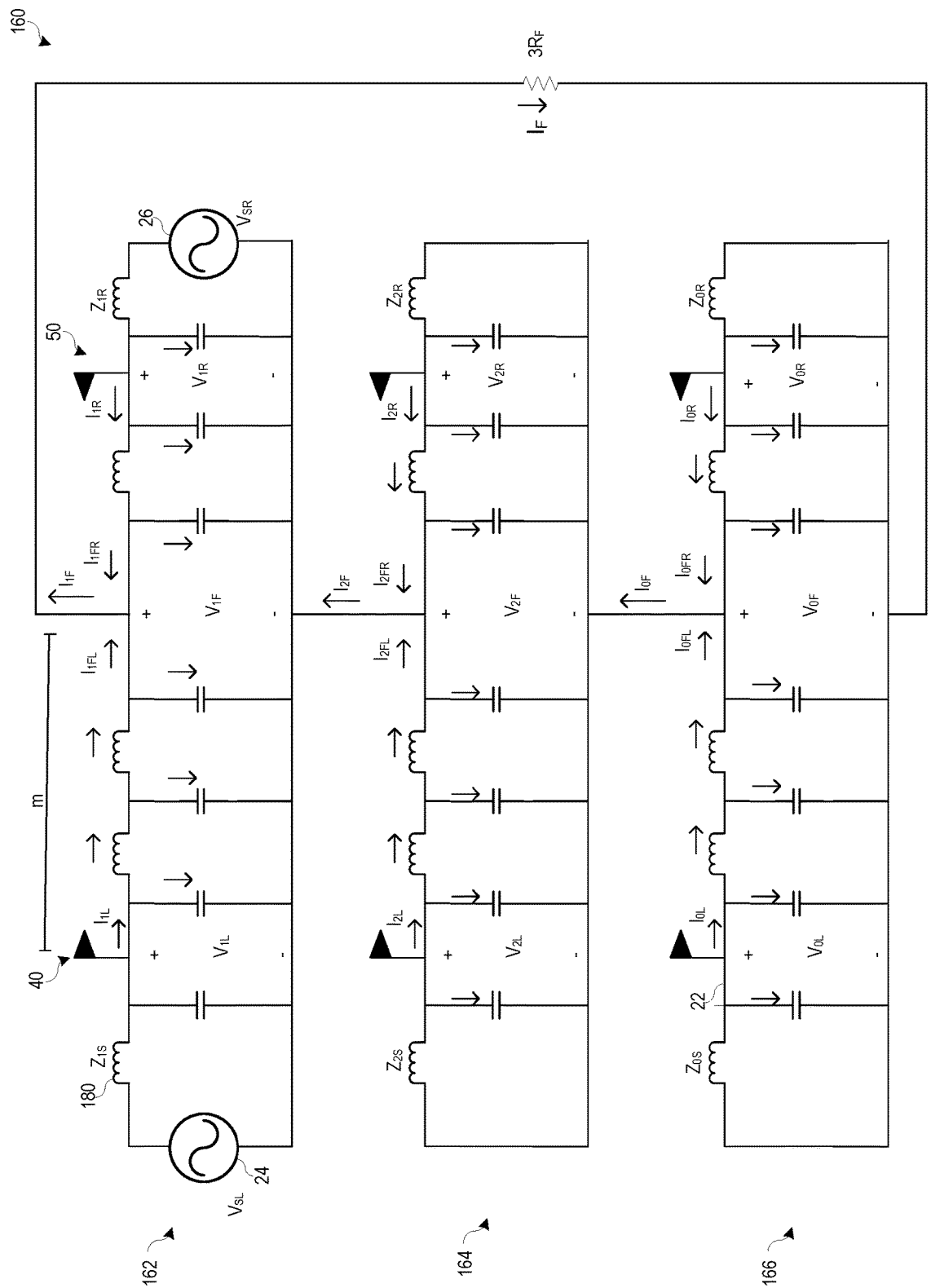
FIG. 4 is a circuit diagram of the sequence network of the electric power delivery system of FIG. 1 for a single line to ground fault, in accordance with embodiments of the present disclosure.

FIG. 4 is a circuit diagram of a sequence domain network 160 of a single line to ground fault. The sequence network 160 includes a positive sequence network 162, a negative sequence network 164, and a zero sequence network 166. The negative sequence current measured at the local relay 40 and the remote relay 50 (i.e., $I_{2L}$ and $I_{2R}$) may not be the same as current flowing into the fault (i.e., $I_{2FL}$ and $I_{2FR}$) because of the shunt capacitances. Thus, by using the differential negative sequence current, an accurate fault current angle may not be estimated. However, by compensating for the shunt capacitances using the pi equivalent circuit, the compensated differential negative sequence current would have approximately the same angle as the fault current angle.

Figure 5:
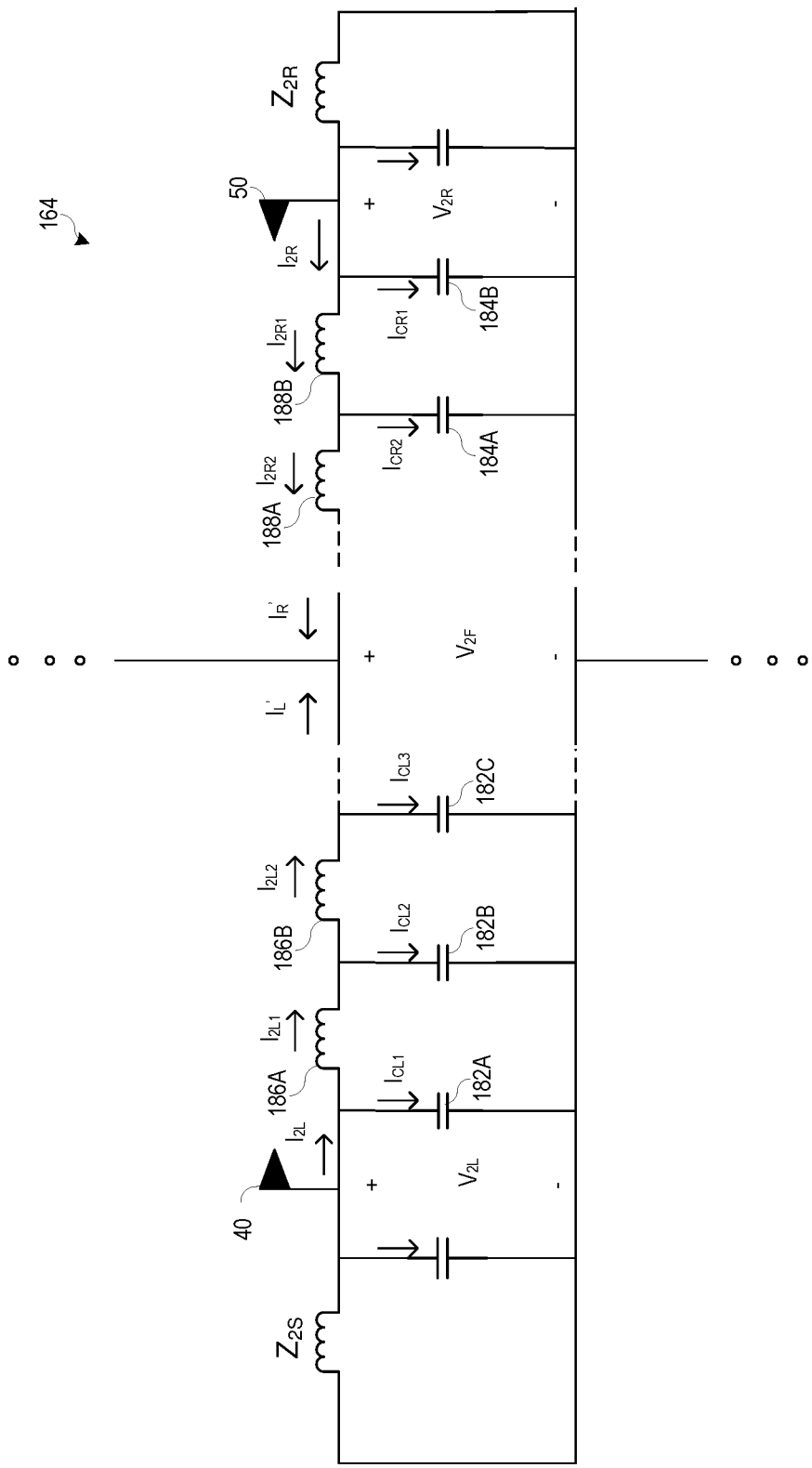
FIG. 5 is a more detailed circuit diagram of the negative sequence network of the electric power delivery system of FIG. 1, in accordance with embodiments of the present disclosure.
Figure 6:
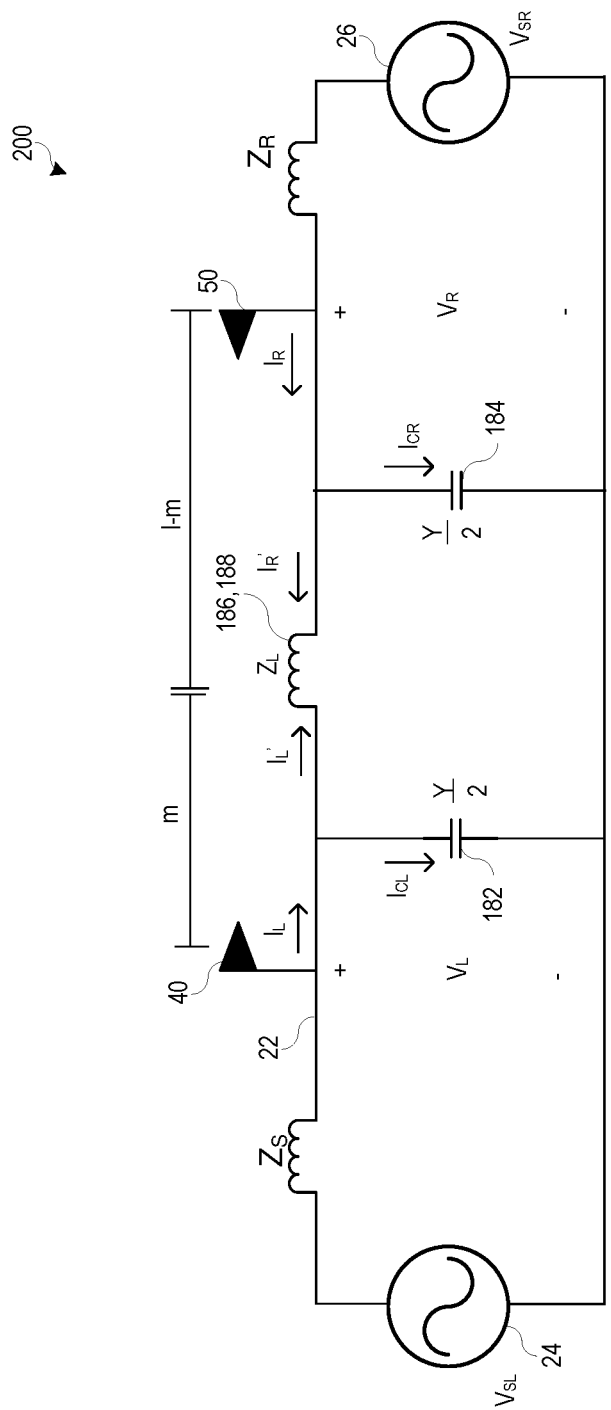
FIG. 6 is a single phase representation of a pi equivalent model of the electric power delivery system of FIG. 1, in accordance with embodiments of the present disclosure.

FIG. 5 is a detailed circuit diagram showing the negative sequence network 164 of the sequence domain network 160. The negative sequence network 164 includes local shunt capacitances represented as capacitors 182A, 182G, and 182C between the local relay 40 and the fault 80 and remote shunt capacitances represented as capacitors 184A and 184G between the remote relay 50 and the fault 80. The negative sequence network 164 further includes local impedances represented as inductors 186A and 186B between the local relay 40 and the fault 80 and remote impedances represented as inductors 188A and 188G between the remote relay 50 and the fault. Note that while the illustrated embodiment includes shunt capacitances and impedances represented by a certain number of capacitors and impedances, any suitable number of shunt capacitances and impedances may be used. The local shunt capacitances and the remote shunt capacitances may add currents in the power line 22 resulting in a increase in current at the fault 80. FIG. 6 is a single phase representation of a pi equivalent model 200 of the electric power delivery system 20. To account for the shunt capacitances, the processor 102 may determine a compensated differential current using a pi equivalent model based on the one or more local current measurements, the one or more remote current measurements, and line parameters. For example, the compensated differential current may be given by:

$$I_{DIFF} = (I_L' - I_R') = [(I_L - I_{CL}) + (I_R I_{CR})] \qquad \text{Eq. 6}$$

where $I_{L'}$ is the compensated current from the local side of the fault, $I_{R'}$ is the compensated current from the remote side of the fault, $I_{CL}$ is an estimate of the capacitance current from the local side accounting to half line shunt susceptance determined using the pi equivalent model, $I_{CR}$ is an estimate of the capacitance current from the remote side accounting to half line shunt susceptance determined using the pi equivalent model. In some embodiments, a compensated differential current may be a compensated negative sequence differential current in unbalanced faults and a compensated positive sequence differential current in balanced faults.

Further, the second technique may use a pi equivalent model or a modified pi equivalent model with modified values of line impedance and shunt susceptances to determine the compensated differential current which accounts for line parameters, such as the shunt capacitances represented by the capacitors 182 and 184. The modified values of line parameters using the pi equivalent model of distributed line may include:

$$Z'_L = Z_L\left(\frac{\sinh(\gamma)}{\gamma}\right) \quad \text{Eq. 7}$$

$$\frac{Y'}{2} = \frac{Y}{2}\left(\frac{\tanh\left(\frac{\gamma}{2}\right)}{\frac{\gamma}{2}}\right) \quad \text{Eq. 8}$$

where $Z_L'$ is a compensated impedance of the power line 22, $Z_L$ is the inductance of the power line 22, $\gamma$ is the line propagation constant, $Y'$ is a compensated admittance, and $Y$ is the admittance due to the shunt capacitance of the power line 22.

Using the pi equivalent model with compensated currents, the voltage from the local relay 40 to the fault may be calculated as $$V_{LF} = mZ_1\left[I'_L + \left(\frac{Z_0 - Z_1}{Z_1}\right)(I'_{0L})\right] \quad \text{Eq. 9}$$

where $I_L'$ is a compensated current being delivered to the fault from the local relay 40 ($I_L - I_{CL}$) and $I_{0L}'$ is a compensated zero sequence current being delivered to the fault 80 from the local relay 40 ($I_{0L} - I_{0CL}$).

By using the compensated current and compensated line parameters using equations (7) and (8), the processor 102 may determine the location of the fault 80 more accurately than the first technique. However, the second technique may have an error in determining the voltage drop from the local relay 40 to the fault 80 ($V_{relay-fault}$), as exact compensation would require knowledge of fault location and negative sequence fault voltage, both of which are unknown. As such, the processor 102 may utilize a third technique that more accurately determines the location of the fault 80 than the first and second techniques, for example, at certain distances and/or in non-homogeneous systems. In the third technique, the processor 102 may determine a fault voltage based on the local measurements and the line parameters.

Relay technology may be improved in the third technique by determining a more accurate location of the fault 80 than the first two techniques because the first two techniques may have errors in calculating the voltage drop from the local relay 40 and/or the remote relay 50 to the fault 80. Further, a more accurate relay may allow for faster assessment of faults by an operator, thereby reducing downtime of the power line 22 and thus improving operation of the electric power delivery system 20.

The fault voltage in the sequence domain and in terms of total fault current may be written as:

$$V_{Fault} = (V_{1F} + V_{2F} + V_{0F}) = I_F R_F \quad \text{Eq. 10}$$

where $V_{1F}$ is a positive sequence fault voltage, $V_{2F}$ is a negative sequence fault voltage, $V_{0F}$ is a zero sequence fault voltage, $I_F$ is the fault current and $R_F$ is the fault resistance.

Multiplying by the conjugate of the total fault current ($I_F^*$) on both sides and taking imaginary parts results in the equation:

$$Im[(V_{1F} + V_{2F} + V_{0F})I_F^*] = Im[I_F R_F I_F^*] = 0 \quad \text{Eq. 11}$$

That is, the first and second technique may determine the location of the fault 80 by removing the fault voltage in equation (3), and, as explained below, the third technique may determine the location of the fault based on the fault voltage by setting an imaginary part of the fault voltage times a differential current to be zero.

By using hyperbolic equations for long transmission lines, the sequence fault voltages of equation (10) may be expressed in terms of local sequence voltages and currents as:

$$V_{1F} = V_{1L}\cosh(\gamma_1 m) - I_{1L} Z_{C1}\sinh(\gamma_1 m) \quad \text{Eq. 12}$$

$$V_{2F} = V_{2L}\cosh(\gamma_1 m) - I_{2L} Z_{C1}\sinh(\gamma_1 m) \quad \text{Eq. 13}$$

$$V_{0F} = V_{0L}\cosh(\gamma_0 m) - I_{0L} Z_{C0}\sinh(\gamma_0 m) \quad \text{Eq. 14}$$

where $V_{1L}$, $V_{2L}$, and $V_{0L}$ are the positive, negative, and zero sequence voltages at the local relay 40 respectively, $\gamma_1$ is the positive sequence line propagation constant, $\gamma_0$ is the zero sequence line propagation constant, $I_{1L}$, $I_{2L}$, and $I_{0L}$ are the positive, negative, and zero sequence currents at the local relay 40 respectively, $Z_{C1}$ is the positive sequence characteristic impedance of the power line 22, $Z_{C0}$ is the zero sequence characteristic impedance of the power line 22, and m is the location of the fault 80 in terms of a distance from the local relay 40 (e.g., in miles or kilometers).

Using the hyperbolic equations, the total fault current ($I_F$) can be accurately expressed in terms of negative sequence currents at the fault point as:

$$I_F = 3(I_{2FL} + I_{2FR}) \quad \text{Eq. 15}$$

where:

$$I_{2FL} = I_{2L}\cosh(\gamma_1 m) - \frac{V_{2L}}{Z_{C1}}\sinh(\gamma_1 m) \text{ and} \quad \text{Eq. 16}$$

$$I_{2FR} = I_{2R}\cosh[\gamma_1(l-m)] + \frac{V_{2R}}{Z_{C1}}\sinh[\gamma_1(l-m)] \quad \text{Eq. 17}$$

where $I_{2FL}$ is the current being delivered to the fault 80 from the local relay side, $I_{2FR}$ is the current being delivered to the fault 80 from the remote relay side, and $l$ is the length of power line 22 in miles or kilometers.

As equation (17) above uses remote voltages, the equation may be written in terms of acquired data, such as local measurements and/or remote currents. Using hyperbolic equations, the remote negative sequence current ($I_{2R}$) may be expressed in terms of negative sequence fault voltage ($V_{2F}$) and negative sequence fault current from the remote relay 50 ($I_{2FR}$) as:

$$I_{2R} = I_{2FR}\cosh[\gamma_1(l-m)] + \frac{V_{2F}}{Z_{C1}}\sinh[\gamma_1(l-m)] \quad \text{Eq. 18}$$

Also from FIG. 4:

$$I_{2F} = I_{2FL} + I_{2FR} \quad \text{Eq. 19}$$

That is, the negative sequence fault current at the fault point may be a sum of the negative sequence fault current at the fault point from the local side and the negative sequence fault current at the fault point from the remote side.

Using equations (13), (16), (18) and (19) $I_{2F}$ may then be expressed as:

$$I_{2F} = \frac{\left[I_{2L}\cosh(\gamma_1 l) - \frac{V_{2L}}{Z_{C1}}\sinh(\gamma_1 l) + I_{2R}\right]}{\cosh[\gamma_1(l-m)]} \qquad \text{Eq. 20}$$

Equations (20), (12), (13), and (14) may be used in (11) to find the fault location (m) expressed as:

$$Im\left\{\begin{bmatrix} (V_{1L} + V_{2L})\cosh(\gamma_1 m) - \\ (I_{1L} + I_{2L})Z_{C1}\sinh(\gamma_1 m) + \\ V_{0L}\cosh(\gamma_0 m) - \\ I_{0L}Z_{C0}\cosh(\gamma_0 m) \end{bmatrix} \begin{bmatrix} I_{2L}\cosh(\gamma_1) - \\ \frac{V_{2L}}{Z_{C1}}\sinh(\gamma_1) + \\ \frac{I_{2R}}{\cosh[\gamma_1(1-m)]} \end{bmatrix}\right\} = 0 \qquad \text{Eq. 21}$$

As discussed earlier the compensated differential negative sequence current gives a good approximation of fault current angle, that is:

$$\angle I_F \approx \angle (I'_{2L} + I'_{2R}) \qquad \text{Eq. 22}$$

As such, the processor 102 may determine the fault location as:

$$Im\left\{\begin{bmatrix} (V_{1L} + V_{2L})\cosh(\gamma_1 m) - \\ (I_{1L} + I_{2L})Z_{C1}\sinh(\gamma_1 m) + \\ V_{0L}\cosh(\gamma_0 m) - \\ I_{0L}Z_{C0}\cosh(\gamma_0 m) \end{bmatrix} [I'_{2L} + I'_{2R}]^* \right\} = 0 \qquad \text{Eq. 23}$$

Equation (23) may be used to determine the fault location and may be comparatively more computationally efficient than equation (21).

In some embodiments, the processor 102 may perform a certain number of iterations to estimate the location of the fault 80. For example, the processor 102 may perform Newton Raphson's method defined as:

$$m_2 = m_1 - \frac{f(m_1)}{f'(m_1)} \qquad \text{Eq. 24}$$

where $m_1$ is the initial value of the fault location, $m_2$ is the next value of the fault location, and $f(m_1)$ is the left hand side of (23) at $m_1$.

Figure 7:
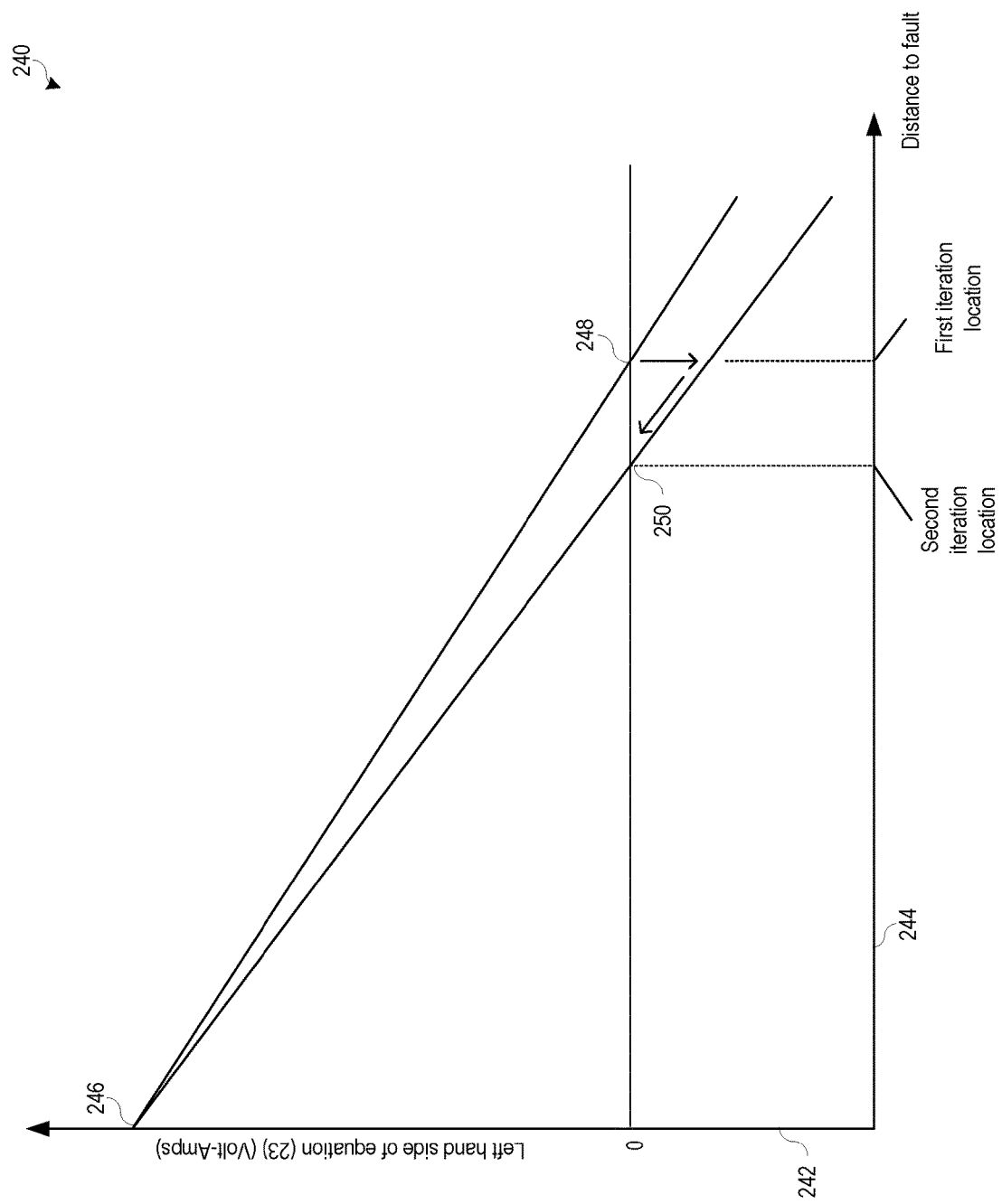
FIG. 7 is a plot of fault location equation (23) over the length of the power line of FIG. 1 for a single line to ground fault at 250 miles, in accordance with embodiments of the present disclosure.

FIG. 7 is a graph 240 illustrating fault location equation (23) over the length of power line 22 of FIG. 1 for a single line to ground fault at 250 miles, according to an embodiment. The processor 102 may determine a first iteration location of the fault 80 using a preset initial value of a fault location in a first iteration. For the first iteration, using equation (24), the initial value of fault location, $m_1$, may be set to zero. As a result of substituting cosh(0)=1 and sinh(0)=0, the processor 102 may determine a first iteration location ($FL_1$) using the equation:

$$FL_1 = \frac{Im[(V_{1L} + V_{2L} + V_{0L})(I'_{2L} + I'_{2R})^*]}{Im\{[(I_{1L} + I_{2L})Z_{C1}\gamma_1 + I_{0L}Z_{C0}\gamma_0][I'_{2L} + I'_{2R}]^*\}} \qquad \text{Eq. 25}$$

Note that while zero is used as an example, any suitable initial value of $m_1$ may be used. By adding and subtracting $I_{0L}Z_{C1}\gamma_1$ in the denominator of (25), and substituting $Z_{C0}\gamma_0 = Z_{L0}$ and $Z_{C1}\gamma_1 = Z_{L1}$, the initial fault location may be:

$$FL_1 = \frac{Im[V_{AL}(I'_{2L} + I'_{2R})^*]}{Im\left\{\left\{Z_{L1}\left[I_{AL} + I_{0L}\frac{(Z_{L0} - Z_{L1})}{Z_{L0}}\right]\right\}[I'_{2L} + I'_{2R}]^*\right\}} \qquad \text{Eq. 26}$$

That is, a difference between the first technique and the third technique is that equation (26) includes a conjugate of the compensated differential negative sequence current. $FL_1$ may be used in a second iteration to determine a second iteration location of the fault 80, more accurate than the first iteration location. In some embodiments, the second iteration location may be used as the location of the fault 80.

The second iteration location of the fault 80 may be determined using the equation:

$$FL_2 = FL_1 - Im\left\{\frac{\begin{bmatrix} (V_{1L} + V_{2L})\cosh(\gamma_1 FL_1) - \\ (I_{1L} + I_{2L})Z_{C1}\sinh(\gamma_1 FL_1) + \\ V_{0L}\cosh(\gamma_0 FL_1) - \\ I_{0L}Z_{C0}\sinh(\gamma_0 FL_1) \end{bmatrix}[I'_{2L} + I'_{2R}]^*}{\begin{bmatrix} \gamma_1(V_{1L} + V_{2L})\sinh(\gamma_1 FL_1) - \\ (I_{1L} + I_{2L})Z_{L1}\cosh(\gamma_1 FL_1) + \\ \gamma_0 V_{0L}\sinh(\gamma_0 FL_1) - \\ I_{0L}Z_{L0}\cosh(\gamma_0 FL_1) \end{bmatrix}[I'_{2L} + I'_{2R}]^*}\right\} \qquad \text{Eq. 27}$$

In some embodiments, the processor 102 may utilize a look-up table, stored in the memory 104, to determine the values of the hyperbolic terms used in equation (27). For example, the look-up table may include potential first iteration location values associated with results of hyperbolic terms. These pre-calculated hyperbolic terms may be used in equation (27) to improve computational efficiency in determining the location of the fault 80. In some embodiments, the second iteration location of the fault 80 may be used as the determined location of the fault.

Figure 8:
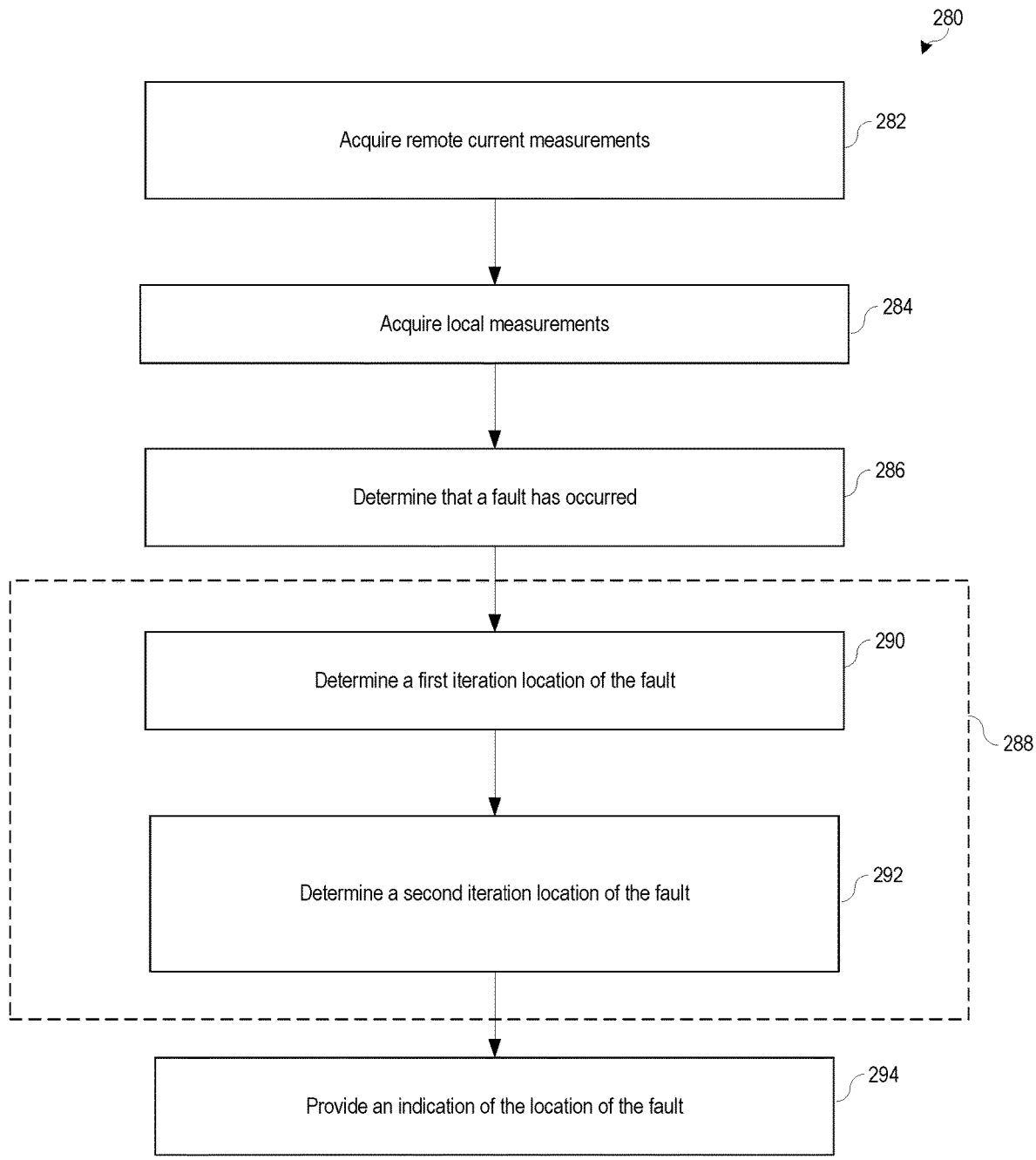
FIG. 8 is a flow diagram of a process performed by the local relay of FIG. 1, in accordance with embodiments of the present disclosure.

FIG. 8 is a flowchart of a process 280 that may be performed by the processor 102 of an IED, such as the local relay 40, in determining the location of the fault 80. For example, instructions may be stored in the memory 104 and/or the computer readable medium 106 to cause the processor 102 to perform the process 280. The process 280 may begin by acquiring time synchronized remote current measurements (block 282). For example, the time synchronized remote current measurements may be acquired via the communication circuitry 56 from an at least one other IED, such as the remote relay 50, on the power line 22. The processor 102 may acquire remote current measurements but not acquire remote voltage measurements, for instance, due to bandwidth limitations at the IED.

The processor 102 may acquire local measurements that include local current measurements and local voltage measurements (block 284). For example, the current sensor circuitry 130 and voltage sensor circuitry 132 may provide a current signal indicating the current on the power line 22 and a voltage signal indicating the voltage on the power line 22, respectively. Analog-to-digital converter(s) 118 may be used to convert the analog current signal and the analog voltage signal to digital current measurements and digital voltage measurements, respectively. The processor 102 may then acquire the digitized current measurements and the digitized voltage measurements from the analog-to-digital converter(s).

The processor 102 may determine that a fault has occurred (block 286). For example, the processor 102 may compare the local current measurements to one or more current thresholds. While detecting an overcurrent is used as an example, any suitable method of determining that a fault has occurred may be used.

Upon determining that a fault 80 has occurred, the processor 102 may determine a location of the fault 80 based on a fault voltage and a compensated differential current (block 288). For example, the compensated differential current may be a sum of the compensated negative sequence current from the IED side (e.g., the local relay 40 side) of the fault 80 and a compensated negative sequence current from the at least one other IED side (e.g., the remote relay 50 side) of the fault 80 that accounts for shunt capacitance currents determined using the pi equivalent of the power line 22. Further, the processor 102 may account for a voltage drop across by the power line 22 by determining the fault voltage using positive, negative, and zero sequence fault voltages expressed in hyperbolic terms. Fault location may not be directly determined using equation (23), as it is not a closed form solution. By performing the newton-raphson method, a location of the fault may be determined iteratively.

The processor 102 may determine a first iteration location of the fault (block 290) based on equation (26). The processor 102 may determine the first iteration location using a preset value as the initial location. From the first iteration location, the processor 102 may determine a second iteration location (block 292) based on equation (27). In some embodiments, the processor 102 may utilize a lookup table that relates potential first iteration locations to results of hyperbolic terms. For instance, the processor 102 may determine that the first iteration location to be a certain location, and then determine, via the look-up table, the results of the hyperbolic terms of equation (27). The processor 102 may then compute the second iteration location based on the local measurements and remote current measurements and the results of the hyperbolic terms from the lookup table. In certain embodiments, the processor 102 may generate the lookup table at the time of commissioning the IED based on the line parameters, as the line parameters may be known at the time of commissioning.

The processor 102 may then provide an indication of the location of the fault (block 294). For example, the processor 102 may send a signal to a display screen to cause the display screen to display the location of the fault to a user. In some embodiments, the display screen may be the display 112 located on the IED. Additionally and/or alternatively, the processor 102 may send a signal, via the communication circuitry 56 to a central monitoring station 72 to cause the central monitoring station 72 to display the location of the fault at a display screen of the central monitoring station 72.

In some embodiments, the processor 102 may compare the determined distance to the fault with a threshold. For example, the threshold may be associated with a zone of protection of the circuit breaker 44. The processor 102 may cause the IED to send a signal (e.g., via the protection circuitry 110) to trip the circuit breaker 44 when the determined distance to the fault falls within the zone of the circuit breaker 44 based on the comparison to the threshold.

As explained above, IED technology may be improved by determining the fault location using the computationally efficient technique which may improve fault location accuracy as compared to other techniques. For example, IED technology, such as relays, may be improved by determining more accurate locations of faults based on the fault voltage and the fault current measured. Further, the computationally efficient technique also accounts for line parameters without using series expansion. As such, relay technology may more efficiently and accurately calculate the distance to the fault to enable the power line to be serviced and brought on-line faster, thereby improving the reliability of the power system. Further, in some embodiments, by controlling operation of a circuit breaker based on improved fault location accuracy may improve reliability of the power system by more accurately removing the fault from the power system.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An intelligent electronic device (IED) configured to communicate with at least one other IED, comprising:
  current sensor circuitry configured to receive one or more signals representative of current of the power line at the IED;
  voltage sensor circuitry configured to receive one or more signals indicative of a voltage of the power line at the IED;
  communication circuitry configured to receive one or more signals representative of one or more remote current measurements on the power line from the at least one other IED;
  a memory; and
  a processor operatively coupled to a memory, wherein the processor is configured to execute instructions stored in the memory to cause the processor to:
    receive local measurements comprising one or more local current measurements from the current sensor circuitry and one or more local voltage measurements from the voltage sensor circuitry;
    determine, from the local measurements and the one or more remote current measurements, a location of a fault on the power line based at least in part on a fault voltage multiplied by a conjugate of a compensated differential current; and
    provide an indication of the location of the fault.

2. The IED of claim 1, wherein the compensated differential current comprises a compensated negative sequence differential current or a compensated positive sequence differential current.

3. The IED of claim 1, wherein the fault voltage comprises a sum of a positive sequence fault voltage, a negative sequence fault voltage, and a zero sequence fault voltage using hyperbolic terms to account for line parameters of the power line.

4. The IED of claim 1, wherein the processor is configured to execute instructions stored in the memory to cause the processor to determine an imaginary part of a resultant phasor from the fault voltage multiplied by the conjugate of the compensated differential current.

5. The IED of claim 1, wherein the processor is configured to execute instructions stored in the memory to cause the processor to:
determine, from the local measurements and the one or more remote current measurements, a first iteration location of the fault using a preset initial value; and
determine a second iteration location of the fault based on the first iteration location; and
provide the indication of the second iteration location as the location of the fault.

6. The IED of claim 5, wherein the processor is configured to execute instructions stored in the memory to cause the processor to determine the second iteration location of the fault using a look up table having potential first iteration locations associated with results of hyperbolic terms.

7. The IED of claim 1, wherein the processor is configured to execute instructions stored in the memory to cause the processor to determine the location of the fault without using voltage measurements from the remote location.

8. The IED of claim 1, wherein the processor is configured to execute instructions stored in the memory to cause the processor to determine the location of the fault based at least in part on a compensated negative sequence differential current that accounts for capacitance currents from the IED and the at least one other IED determined using a pi equivalent line model.

9. The IED of claim 8, wherein the processor is configured to execute instructions stored in the memory to cause the processor to determine the compensated differential current, when the fault is an unbalanced fault, as:

$$I_{2DIFF} = [(I_{2L} + I_{2R}) - (I_{2CL} + I_{2CR})]$$

where $I_{2L}$ is a negative sequence current at the IED, $I_{2R}$ is a negative sequence current at the at least one other IED, $I_{2CL}$ is the estimated shunt capacitance current determined at the IED using the pi equivalent model, and $I_{2CR}$ is the estimated shunt capacitance current determined at the at least one other IED using the pi equivalent model.

10. The IED of claim 1, wherein the processor is configured to execute instructions stored in the memory to cause the processor to determine the fault voltage based at least in part on sequence fault voltages in terms of the local measurements and the one or more remote current measurements.

11. A method, comprising:
receiving, via sensor circuitry of an intelligent electronic device (IED), one or more local measurements of a power line;
receiving, via communication circuitry of the IED, a signal indicating one or more remote current measurements of the power line from at least one other IED;
determining, via a processor of the IED, a location of a fault on the power line based at least in part on a fault voltage multiplied by a conjugate of a compensated differential current; and
providing the location of the fault.

12. The method of claim 11, wherein the power line comprises a multi-terminal line and the fault voltage is based on the one or more local measurements and the one or more current measurements from each of the remote terminals of the multi-terminal line.

13. The method of claim 11, comprising:
determining a first iteration location of the fault based on a predetermined initial value; and
determining a second iteration location of the fault based on the first iteration location.

14. The method of claim 11, comprising determining an initial location of the fault ($F_{L1}$) for an A phase to ground fault as:

$$FL_1 = \frac{Im[V_{AL}(I'_{2L} + I'_{2R})^*]}{Im\left\{\left\{Z_{L1}\left[I_{AL} + I_{0L}\frac{(Z_{L0} - Z_{L1})}{Z_{L0}}\right]\right\}[I'_{2L} + I'_{2R}]^*\right\}}$$

where $V_{AL}$ is an A phase voltage at the IED, $I_{2L}'$ and $I_{2R}'$ are the compensated negative sequence currents, $I_{AL}$ is the A phase current at the IED, $I_{0L}$ is the zero sequence current at the IED respectively, and $Z_{L0}$ and $Z_{L1}$ are zero sequence and positive sequence impedances of the power line respectively.

15. The method of claim 11, comprising determining a second iteration location of the fault based on an first iteration location ($FL_1$), wherein the second iteration location ($FL_2$) of the fault is determined using an equation:

$$FL_2 = FL_1 - Im\left\{\frac{\begin{bmatrix}(V_{1L} + V_{2L})\cosh(\gamma_1 FL_1) - \\ (I_{1L} + I_{2L})Z_{C1}\sinh(\gamma_1 FL_1) + \\ V_{0L}\cosh(\gamma_0 FL_1) - \\ I_{0L}Z_{C0}\sinh(\gamma_0 FL_1)\end{bmatrix}[I'_{2L} + I'_{2R}]^*}{\begin{bmatrix}\gamma_1(V_{1L} + V_{2L})\sinh(\gamma_1 FL_1) - \\ (I_{1L} + I_{2L})Z_{L1}\cosh(\gamma_1 FL_1) + \\ \gamma_0 V_{0L}\sinh(\gamma_0 FL_1) - \\ I_{0L}Z_{L0}\cosh(\gamma_0 FL_1)\end{bmatrix}[I'_{2L} + I'_{2R}]^*}\right\}$$

where $V_{1L}$ is the positive sequence voltage at the IED, $V_{2L}$ is the negative sequence voltage at the IED, $\gamma_1$ is the positive sequence line propagation constant, $I_{1L}$ is the positive sequence current at the IED, Ia is the negative sequence current at the IED, $Z_{C1}$ is the positive sequence characteristic impedance of the power line, $V_{0L}$ is the zero sequence voltage at the IED, $\gamma_0$ is the zero sequence line propagation constant, and $Z_{C0}$ is the zero sequence characteristic impedance of the power line.

16. The method of claim 15, comprising determining hyperbolic terms of the equation via a lookup table that associates potential first iteration locations to results of the hyperbolic terms based on the line parameters.

17. The method of claim 16, comprising generating the lookup table upon commissioning of the IED or during a settings change of the IED.

18. The method of claim 10, comprising:
when the fault is a balanced fault, determining the fault voltage using positive sequence values of the local measurements;
when the fault is an unbalanced ungrounded fault, determining the fault voltage based on the positive sequence values, negative sequence values, and zero sequence values of the local measurements; and when the fault is an unbalanced grounded fault, determining the fault voltage based on the positive sequence values and the negative sequence values of the local measurements.

19. The method of claim 10, comprising:

when the fault is a balanced fault on a multi-terminal line, determining the fault voltage using positive sequence values of the local measurements and positive sequence values of the remote currents;

when the fault is an unbalanced ungrounded fault on the multi-terminal line, determining the fault voltage based on the positive sequence values, negative sequence values, and zero sequence values of the local measurements and positive sequence values, negative sequence values, and zero sequence values of the remote currents; and when the fault is an unbalanced grounded fault on the multi-terminal line, determining the fault voltage based on the positive sequence values and the negative sequence values of the local measurements and the positive sequence values and negative sequence values of the remote currents.

20. A non-transitory computer readable medium comprising instructions that, when executed by a processor, cause the processor to perform operations comprising:

receiving local measurements comprising one or more local current measurements from the current sensor circuitry and one or more local voltage measurements from the voltage sensor circuitry;

determining, from the local measurements and the one or more remote current measurements, a location of a fault on the power line based at least in part on a fault voltage multiplied by a conjugate of a compensated differential current; and providing an indication of the location of the fault.

21. The non-transitory, computer readable medium of claim 19, comprising instructions that, when executed by a processor, cause the processor to perform operations comprising determining the location of the fault based on an imaginary part of the fault voltage multiplied by a conjugate of a compensated differential current.

22. The non-transitory, computer readable medium of claim 19, wherein the using the fault voltage comprising a positive sequence fault voltage, a negative sequence fault voltage, and a zero sequence fault voltage using hyperbolic terms to account for line parameters of the power line.

* * * * *